United States Patent [19]
Taki et al.

[11] Patent Number: 5,305,110
[45] Date of Patent: Apr. 19, 1994

[54] CHASSIS APPARATUS
[75] Inventors: Naoya Taki, Toyonaka; Osamu Ogasawara, Ibaraki, both of Japan
[73] Assignee: Matsushita Electric Industrial Co., Ltd., Osaka, Japan
[21] Appl. No.: 782,592
[22] Filed: Oct. 25, 1991
[30] Foreign Application Priority Data
Nov. 9, 1990 [JP] Japan .................. 2-305121
[51] Int. Cl.$^5$ ........................................... H04N 5/645
[52] U.S. Cl. ................................................ 348/836
[58] Field of Search ............................... 358/248–249, 358/254–255

[56] References Cited
U.S. PATENT DOCUMENTS
5,084,757 1/1992 Leo et al. ..................... 358/248
5,145,434 9/1992 Pauplis et al. .................. 358/248

Primary Examiner—Stephen Brinich
Attorney, Agent, or Firm—Stevens, Davis, Miller & Mosher

[57] ABSTRACT

In a chassis connection apparatus and a chassis formed by using it, a front operation block fixed to a housing by means of a claw-shaped lock mechanism is connected to a chassis frame with a main circuit installed thereon at the back of the front operation block. The chassis can be taken out of the housing by merely pulling the chassis frame backward and releasing a claw-shaped lock. In the construction described above, an engagement section is disposed in a section where the chassis connection apparatus is connected to the chassis frame, so that the chassis frame can be connected at a later time.

7 Claims, 5 Drawing Sheets

CHASSIS APPARATUS

BACKGROUND OF THE INVENTION

1. Field of the Invention

The present invention relates to a chassis connection apparatus in a television receiver or the like, which can be used when a chassis must be taken out of a housing during manufacturing/assembly and maintenance on the market.

2. Description of the Related Art

In recent years, the chassis structure of a television receiver has been usually divided into a front operation block in which operation sections for adjusting the volume of sound and selecting a channel are collected and a chassis frame on which a main circuit is mounted.

For this reason, in a manufacturing/assembling process, the front operation block is connected to a chassis frame by using a harness with a lead wire in terms of the circuit. As to the construction of the block and frame, they are connected to each other and made into one piece by using a chassis connection apparatus. To reduce the number of manufacturing/ assembling process steps, the front operation block, the chassis connection apparatus and the chassis frame are collectively installed in the housing. The front operation block is fixed to the housing by screws so that it will not move downward due to an external force which is applied thereto during front side of the receiver operations.

The construction of a conventional chassis connection apparatus will now be explained with reference to FIGS. 4 and 5.

In FIG. 4, reference numeral 1 denotes a chassis connection apparatus; reference numeral 2 denotes an engagement claw section for connecting a front operation block 5 to the chassis connection apparatus 1 by engaging the claw section 2 with a mounting engagement hole section 5a disposed on the front operation block 5; reference numeral 3 denotes an engagement shaft for connecting a chassis frame 6 to the chassis connection apparatus 1 by engaging the engagement shaft 3 with a mounting engagement section 6a disposed on the chassis frame 6; and reference numeral 4 denotes a guide section for engagement with a housing 7.

In FIG. 5, reference numeral 7 denotes a housing of a television receiver; reference numeral 7a denotes a boss, disposed on the housing 7, for mounting the front operation block 5; reference numeral 8 denotes an operation tray mounted on the front operation block 5; reference numeral 9 denotes an AV terminal mounted on the front operation block 5; and reference numerals 10 denote screws for mounting the front operation block 5.

The operation of the chassis connection apparatus, together with the chassis constructed by using it, constructed as described above will now be explained with reference to FIGS. 4 and 5.

The chassis connection apparatus 1 connects the front operation block 5 to the chassis frame 6 with a main circuit installed thereon by a method in which the engagement claw section 2 is engaged with the mounting engagement claw section 5a disposed on the front operation block 5, and in which the engagement shaft 3 is engaged with the mounting engagement hole 6a disposed on the chassis frame 6. The chassis connected as described above is fixed to the housing 7 by screws 10 so that it will not move downward due to an external force which is applied thereto during operations of the front operation block 5.

However, in the chassis connected as described above and the chassis connection apparatus which forms it, there is a problem in that the number of assembly steps at a factory is increased, i.e., the front operation block must be fixed by screws for preventing the front operation block from moving downward due to an external force applied thereto during the operations of the front operation block, and the front operation block must be removed when the chassis has to be taken out of the housing during maintenance or the like. There is another problem in that, since the front operation block and the chassis connection apparatus, and the chassis to which the chassis frame is connected, collectively, must be incorporated into the housing during assembling at a factory, it is difficult to handle the chassis when the chassis is encased in the housing.

SUMMARY OF THE INVENTION

The present invention has been accomplished in light of the above-described circumstances.

An object of the present invention is to provide a chassis connection apparatus which is capable of connecting the front operation block, which can be fixed to a housing by means of a claw-shaped lock structure, to the chassis frame on which a main circuit is installed. This apparatus has a construction by which the claw-shaped lock of the front operation block can be released by pulling the chassis frame backward, said chassis connection apparatus requiring no screws to fix the chassis, and in which the chassis frame can be mounted after the front operation block is mounted on the housing, and then the block and frame can be connected.

To solve the above-described problems, a chassis connection apparatus and a chassis constructed by using it are characterized in that the front operation block fixed to the housing by means of a claw-shaped lock is connected to the chassis frame, at the back thereof, with a main circuit installed thereon, and that the chassis can be taken out of the housing by merely pulling the chassis frame backward and thus releasing the claw-shaped lock mechanism. In addition, an engagement section is disposed in the section where the chassis connection apparatus is connected to the chassis frame, so that the chassis frame can be connected at a later time.

With the construction described above, according to the present invention, the chassis can be fixed without fixing the front operation block by using screws. The chassis can be easily taken out of the housing by releasing the claw-shaped lock by which the front operation block is fixed by merely pulling the chassis frame backward. Furthermore, the chassis can be easily handled at a factory because the chassis frame with a main circuit installed thereon can be connected after the front operation block and the chassis connection apparatus are incorporated into the housing during an assembling operation at a factory.

These and other objects, features and advantages of the present invention will become clear when reference is made to the following description of the preferred embodiments of the present invention, together with reference to the accompanying drawings.

BRIEF DESCRIPTION OF THE DRAWINGS

FIG. 2A is a cross-sectional view which illustrates a state in which the chassis is engaged with the housing when the chassis is fixed to the housing;

FIG. 2B is a cross-sectional view which illustrates operations when the chassis is removed from the housing;

FIG. 3A is a top plan view which illustrates a state in which a connection pin slides on a guide section of the chassis frame;

FIG. 3B is a top plan view which illustrates a state in which a connection pin is fitted into an engagement hole of the chassis frame and the connection is completed;

DESCRIPTION OF THE PREFERRED EMBODIMENT

A chassis connection apparatus of an embodiment of the present invention will be explained below with reference to the accompanying drawings.

Figure 1:
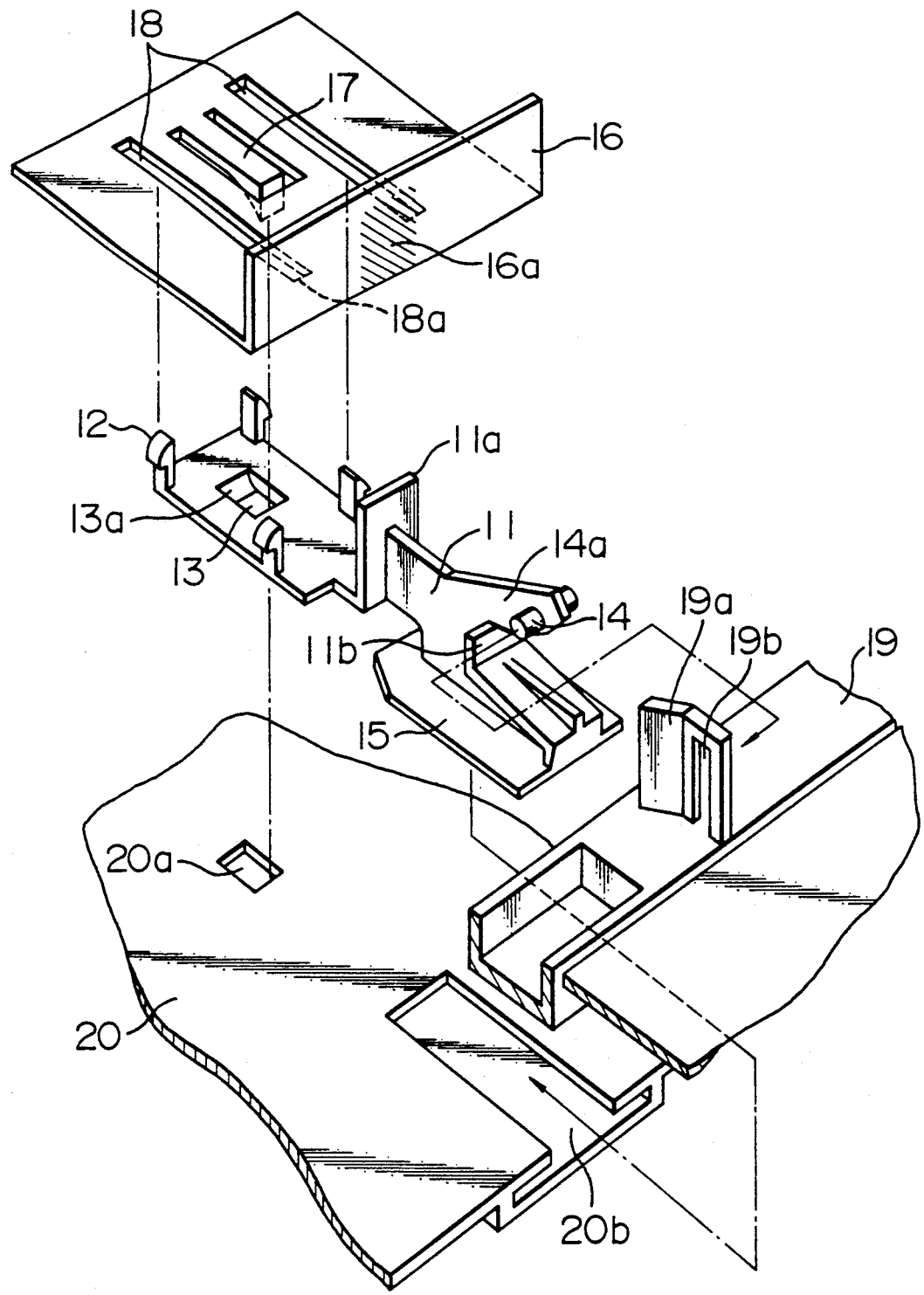
FIG. 1 is a schematic view which illustrates a section where a chassis is connected by using a chassis connection apparatus according to an embodiment of the present invention.

In FIG. 1, a front operation block 16 has a sliding groove section 18 into which a chassis connection apparatus 11 having a claw-shaped lock 17 and a claw-shaped lock releasing mechanism are mounted. The block 16 is made to slide back and forth and mounted in a state in which the claw of the claw-shaped lock 17 is hooked into an engagement hole 20a of a housing 20 via a hole 13 of the chassis connection apparatus 11. The chassis connection apparatus 11 is mounted in a state in which the claw of the claw-shaped lock 17 of the front operation block 16 is put through the hole 13, and an engagement mounting claw 12 is fitted into a sliding groove 18 of the front operation block 16. The chassis connection apparatus 11 is constructed so as to be capable of sliding back and forth independently. A chassis frame 19 with a main circuit installed thereon has a guide section 19a in an engagement hole 19b into which a connection pin 14 of the chassis connection apparatus 11 is guided and mounted. The chassis connection apparatus 11 is connected to the chassis frame by the connection pin 14 being engaged with the mounting engagement hole 19b of the chassis frame 19. Although in this embodiment, a mounting flange 15 is inserted into the mounting engagement hole 20a of the housing 20 and positioning is performed in the chassis connection apparatus 11, this positioning may be performed in either one of the front operation block 16 and the chassis frame 19, or in both of them.

The operation of the chassis connection apparatus having a claw-shaped lock mechanism, which is in the chassis constructed as described above, will now be explained with reference to FIGS. 1, 2 and 3.

Figure 2A:
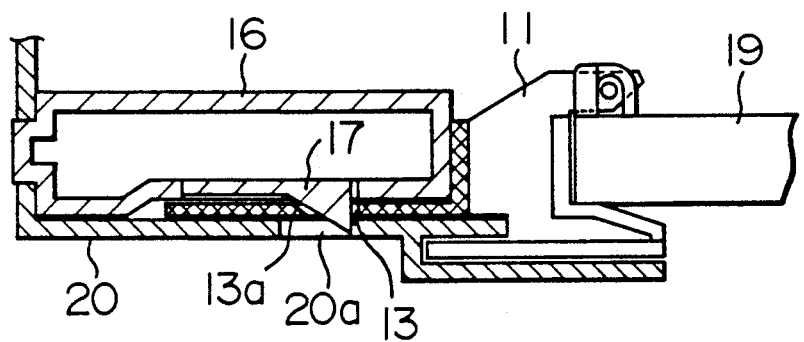
FIGS. 2A and 2B are views which illustrate a state in which a connection apparatus is operating when a chassis is taken out of a housing.
Figure 2B:
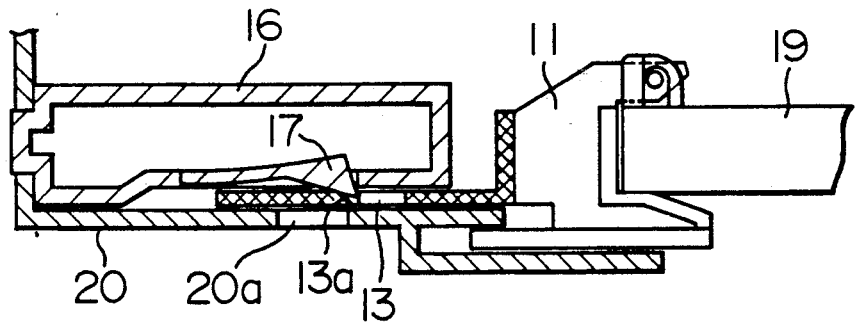

The chassis shown in FIG. 2A is in a state as seen in a schematic side cross-sectional view of the chassis connected and mounted on the housing shown in FIG. 1. The front operation block 16 is mounted in a state in which the claw of the claw-shaped lock 17 is hooked into the engagement hole 20a of the housing 20 through the hole 13 of the chassis connection apparatus 11. When the chassis is taken out of the housing 20, the chassis connection apparatus 11 connected via the engagement shaft to the chassis frame 19 retreats backward if the chassis frame 19 is also pulled backward. An inclined surface 13a disposed in the hole 13 through which the claw of the claw-shaped lock 17 of the front operation block 16 of the chassis connection apparatus 11 is put picks up the claw of the claw-shaped lock 17 of the front operation block 16. The claw of the claw-shaped lock 17 is unhooked from the engagement hole 20a of the housing 20, releasing the claw-shaped lock. As a result, a state shown in FIG. 2B is created.

When the chassis frame is pulled further backward, the engagement claw 12 connecting the chassis frame to the front operation block 16 of the chassis connection apparatus 11 is brought into abutment with a terminating edge 18a of a sliding groove 18 of the front operation block 16. The front operation block 16 can be easily taken out of the housing 20 because it is pulled by the chassis connection apparatus 11 while the claw-shaped lock 17 is being released.

When the chassis is mounted on the housing 20, a front side pressing surface 11a of the chassis connection apparatus 11 is pressed against a portion 16a of the back surface of the front operation block 16, and a back receiving surface 11b is pressed against a front edge of the chassis frame. As a result, a chassis which maintains a rigid state when it is moved in a forward and backward direction can be constructed. Sandwiching this chassis between the housing 20 and a back lid (not shown) prevents the claw-shaped lock from being damaged.

Figure 3A:
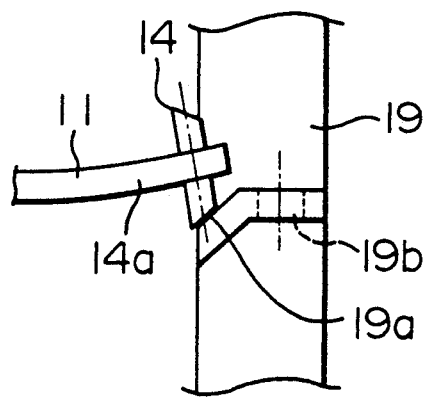
FIGS. 3A and 3B are top plan views which illustrate operations when the chassis connection apparatus is connected to the chassis frame.
Figure 3B:
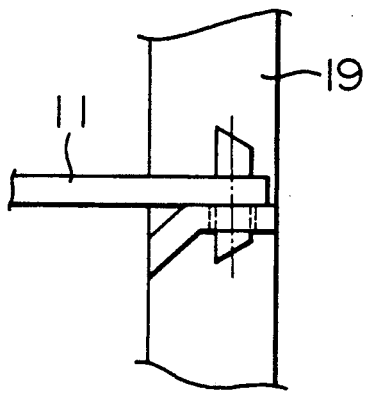
Figure 4:
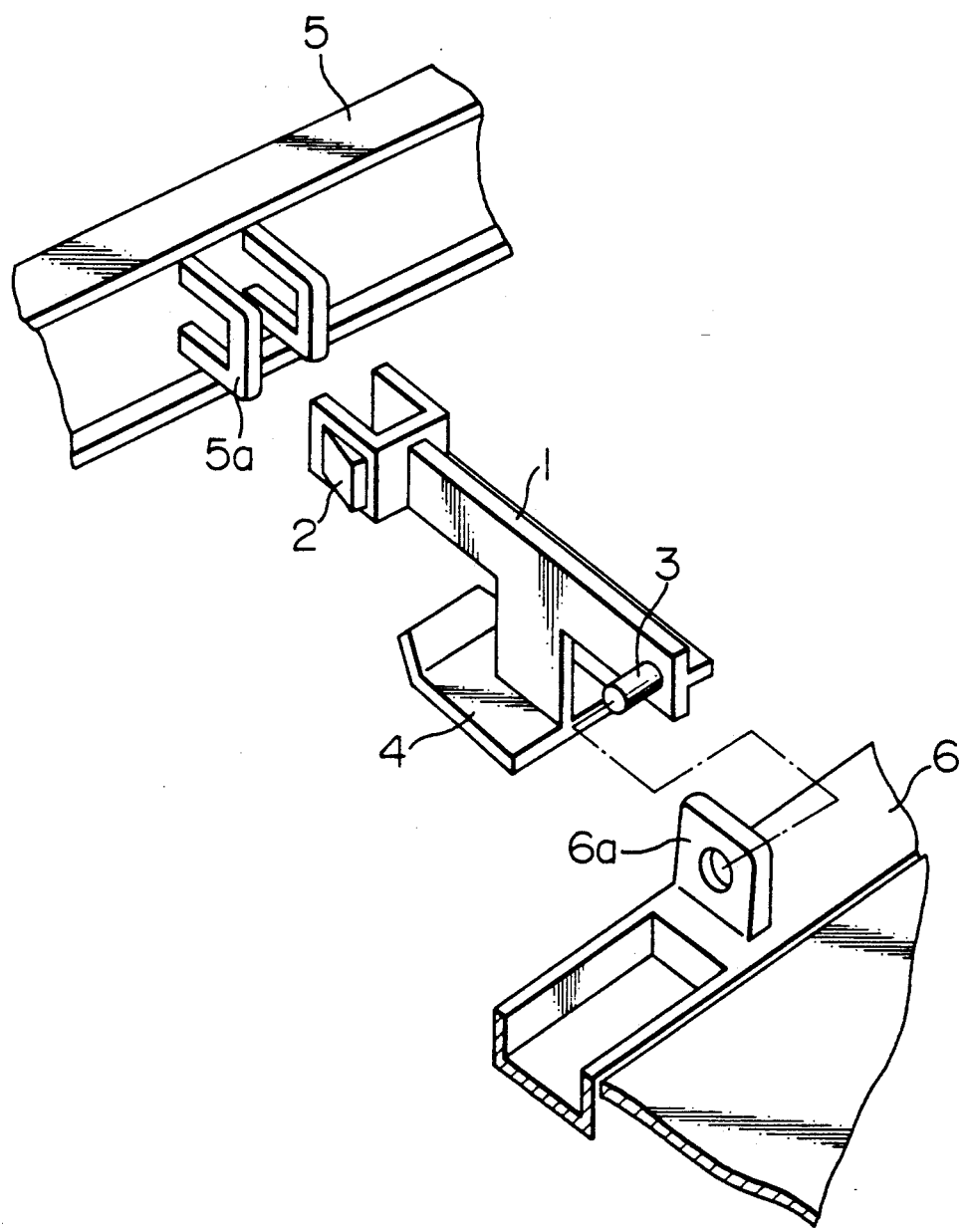
FIG. 4 is a schematic view which illustrates a conventional chassis connection apparatus.
Figure 5:
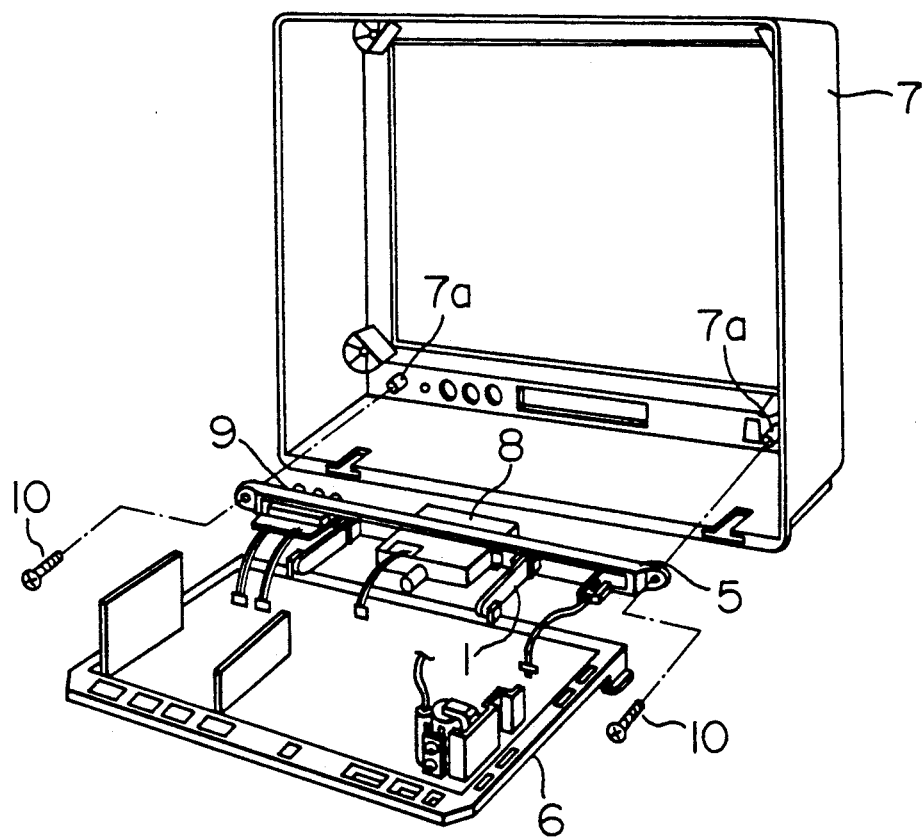
FIG. 5 is a schematic view which illustrates how the chassis formed by using the conventional chassis connection apparatus is mounted on the housing.

Furthermore, a small elastic section 14a is disposed in the section of the connection pin 14 connecting the chassis frame 19 of the chassis connection apparatus 11, and the guide section 19a for guiding the connection pin 14 of the chassis connection apparatus 11 is disposed in front of the mounting engagement hole 19b of the chassis frame. As a result, when the chassis frame is connected to additionally after the front operation block 16 and the chassis connection apparatus 11 are previously mounted on the housing, the connection pin 14 of the chassis connection apparatus 11 moves along the guide section 19a of the chassis frame 19, as shown in FIG. 3A. The chassis frame 19 is moved forward while the elastic section 14a is being flexed. The connection pin 14 of the chassis connection apparatus 11 enters the mounting engagement hole of the chassis frame 19. The chassis frame 19 can be connected to the front operation block 16 mounted on the housing 20 via the chassis connection apparatus 11.

As has been explained above, according to this embodiment, the chassis can be mounted securely without using screws by a sandwiched construction of the claw-shaped lock structure, and the housing and the back lid. The chassis can be taken out of the housing by merely pulling the chassis frame backward. It is also possible that, after the housing and the front operation block are mounted, for the chassis frame to be mounted and connected during assembly at a factory. The chassis can be easily handled during a process for encasing the chassis at a factory.

As has been explained above, according to the present invention, the chassis can be easily taken out of the housing by merely pulling the chassis frame backward without using tools and releasing the claw-shaped lock by which the front operation block is fixed by forming the chassis connection apparatus so it is capable of pulling and releasing the claw-shaped lock of the front operation block fixed by the claw-shaped lock. Furthermore, since the chassis frame can be connected at a time after the chassis connection apparatus is disconnected from the chassis frame, the chassis can be easily handled during assembly at a factory. Thus, chassis apparatuses suitable for mechanization can be provided.

Many different embodiments of the present invention may be constructed without departing from the spirit and scope of the present invention. It should be understood that the present invention is not limited to the specific embodiments described in this specification, and is only limited in the appended claims.

What is claimed is:

1. A chassis apparatus for electronic means, comprising:
   a chassis connection apparatus having connection means for connecting with a chassis section in one end of said chassis connection apparatus and mounting means which is capable of sliding on an operation section within a certain range in the other end of said chassis connection apparatus,
   wherein the operation section is releasably mounted on an engagement section of a chassis housing via the chassis connection apparatus and engaged.

2. A chassis apparatus, comprising:
   chassis connection means rotatably connected to a chassis in one end thereof;
   slidable mounting means for slidably mounting an operation section in the other end thereof; and
   a chassis connection apparatus in which an opening is formed through which engagement means for releasably engaging the operation section in an engagement section of a chassis housing,
   wherein the operation section and the chassis are connected to each other, and wherein the operation section releasably engaged with a cabinet housing by the engagement means via the opening can be taken out of the cabinet housing in a state in which the engagement state of the cabinet housing is released by the sliding of the chassis connection apparatus and the operation section is connected to chassis.

3. A chassis apparatus, comprising:
   a front operation block fixed to a housing by a claw-shaped lock mechanism;
   a chassis frame with a main circuit installed thereon at the back of the front operation block; and
   a chassis connection apparatus for connecting the front operation block and the chassis frame to each other,
   said chassis connection apparatus being provided with a claw-shaped lock releasing mechanism such that a section connecting the front operation block and the chassis connection apparatus pulls up and releases the claw-shaped lock mechanism by which the front operation block is fixed to the housing and thus a chassis can be easily taken out of the housing, because when the chassis is taken out of the housing, the chassis connection apparatus connected to the chassis frame slides backward if the chassis frame is also pulled backward.

4. A chassis apparatus according to claim 3, wherein the front operation block and the chassis connection apparatus can be mounted onto the housing and they are made into one piece, because a projected hooking portion is provided in a section where the chassis is connected to the chassis frame so that this portion is hooked and engaged with the chassis frame.

5. A chassis apparatus according to claim 3, wherein the claw-shaped lock mechanism of the front operation block is prevented from being damaged due to an external force applied to the front operation block fixed by the claw-shaped lock mechanism during operations, because a portion for pressing the front operation block and a portion for receiving the chassis frame are provided and the chassis is sandwiched between the housing and a back lid in a rigid state between the two portions.

6. A chassis apparatus according to claim 3, wherein the chassis connection apparatus is connected via an engagement section to the chassis frame of the chassis connection apparatus.

7. A chassis apparatus according to claim 6, wherein the engagement section connecting the chassis connection apparatus to the chassis frame has a guide section and an elastic section, by means of which positional deviations are allowed for when the chassis connection apparatus is connected to the chassis frame.

* * * * *